United States Patent [19]

Herzog et al.

[11] Patent Number: 4,949,146
[45] Date of Patent: Aug. 14, 1990

[54] STRUCTURED SEMICONDUCTOR BODY

[75] Inventors: Hans J. Herzog, Neu-Ulm; Klaus Wörner, Leingarten; Erich Kasper, Pfaffenhofen, all of Fed. Rep. of Germany

[73] Assignees: Licentia Patent-Verwaltungs GmbH, Frankfurt am Main; Telefunken electronic GmbH, Heilbronn, both of Fed. Rep. of Germany

[21] Appl. No.: 941,225

[22] Filed: Dec. 12, 1986

[30] Foreign Application Priority Data

Dec. 20, 1985 [DE] Fed. Rep. of Germany ....... 3545238

[51] Int. Cl.$^5$ ............................................. H01L 29/72
[52] U.S. Cl. ........................................ 357/34; 357/59; 357/47; 437/79; 437/99
[58] Field of Search ............... 357/59 H, 34, 59 K, 357/47; 437/79, 99, 105

[56] References Cited

U.S. PATENT DOCUMENTS

| | | | |
|---|---|---|---|
| 3,617,822 | 11/1971 | Kobayashi | 437/79 |
| 3,730,765 | 5/1973 | Stein | 437/99 |
| 3,791,882 | 2/1974 | Ogiue | 437/99 |
| 3,894,893 | 7/1975 | Kabaya | 437/79 |
| 4,001,858 | 1/1977 | Ballamy | 354/47 |
| 4,157,269 | 6/1979 | Ning et al. | 357/59 H |
| 4,184,172 | 1/1980 | Raffel et al. | 437/99 |
| 4,396,933 | 8/1983 | Magdo | 357/55 |
| 4,425,574 | 1/1984 | Silvestri | 357/59 H |
| 4,467,519 | 8/1984 | Glang | 357/51 |
| 4,499,657 | 2/1985 | Ooga | 357/59 H |
| 4,663,831 | 5/1987 | Birrittella | 357/59 H |

FOREIGN PATENT DOCUMENTS

| | | | |
|---|---|---|---|
| 2128539 | 2/1972 | Fed. Rep. of Germany . | |
| 56-54064 | 5/1981 | Japan | 357/34 |
| 58-52843 | 3/1982 | Japan | 437/79 |
| 58-34943 | 3/1983 | Japan | 437/99 |
| 57-72373 | 5/1987 | Japan | 357/34 |

OTHER PUBLICATIONS

*Electronics*, vol. 41, #20, p. 209, Sep. 1968.
Y. Ota, "Silicon Molecular Beam Epitaxy", *Thin Solid Films*, vol. 106, Aug. 1983, pp. 86–112.
H. J. Herzog, et al, "Silicon Layers Grown by Differential Molecular Beam Epitaxy", *Journal of the Electrochemical Society*, vol. 132, No. 9, 1985, pp. 2227–2231.

Primary Examiner—Andrew J. James
Assistant Examiner—Mark Prenty
Attorney, Agent, or Firm—Spencer & Frank

[57] ABSTRACT

A structured semiconductor body e.g., an integrated circuit or a transistor, based on an silicon substrate having barrier regions which contain polycrystalline silicon, preferably produced by a silicon MBE process. The barrier regions are required to delimit monocrystalline silicon semiconductor regions and/or structures to prevent undesirable current flow.

18 Claims, 1 Drawing Sheet

STRUCTURED SEMICONDUCTOR BODY

BACKGROUND OF THE INVENTION

The present invention relates to a structured semiconductor body of the type comprising at least a plurality of differently doped monocrystalline silicon semiconductor regions delimited by at least one barrier region which prevents undesirable electrical current flow, as well as to a method of forming the structured semiconductor body.

The invention can be used, in particular, for the manufacture of transistors and/or integrated circuits (IC's) which are based on a silicon (Si) substrate.

A known exemplarily selected bipolar semiconductor structure of the above type which can be produced with the aid of presently customary processes, e.g. masking by means of lithography, oxidation, diffusion, implantation, epitaxy and metallization processes, is shown in FIG. 1.

According to FIG. 1, an n+doped so-called buried semiconductor zone (buried layer) 2 is initially produced by the known methods on an exemplary p- doped Si substrate 1, e.g. a monocrystalline Si wafer having a diameter of about 75 mm, a thickness of about 0.5 mm and a (100) crystal orientation. This is followed by the production of the semiconductor regions required for a bipolar transistor, i.e. an n—doped region 3, an n+ doped collector contact region 4, a p doped base region 5 as well as an n+doped emitter region 6 disposed within the base region 5. To avoid undesirable electrical current flow, this semiconductor structure is delimited by at least one barrier region 7, which in this example is configured as a p+doped semiconductor region extending from the outer surface of the semiconductor body into the p- doped substrate 1. Electrical short circuits are avoided in that this semiconductor structure is covered by an oxide layer 8, e.g. of silicon dioxide, into which contacting windows have been etched. The base terminal B, the emitter terminal E and the collector terminal C for the bipolar transistor are produced by applying a structured metal layer 9 to the outer surface of the oxide layer 8 so as to contact the regions 5, 6 and 4 respectively via the contacting windows.

In such a structured semiconductor body, the barrier region 7, which is shown, for example, as a semiconductor region doped as a blocking pn-junction, can be produced only by uneconomical insulation diffusion and/or insulation oxidation processes. The barrier region 7 is here intended to avoid undesirable current flow, e.g. between adjacent transistors of an integrated circuit.

SUMMARY OF THE INVENTION

It is therefore an object of the present invention to provide a structured semiconductor body of the hereinabove generally described type in which, in particular, the barrier region can be reliably and economically produced.

The above and other objects are generally accomplished according to the present invention by a structured semiconductor body comprising at least a plurality of differently doped monocrystalline silicon semiconductor regions which are formed on a silicon substrate and which are delimited by at least one barrier region which prevents undesirable electrical current flow between the silicon semiconductor regions, and wherein the barrier region is composed at least in part of polycrystalline silicon.

Preferably, the barrier region comprises a layer of silicon oxide formed on the surface of the silicon substrate, and a layer of polycrystalline silicon disposed on the surface of the silicon oxide layer, which is preferably silicon dioxide.

According to one feature of the invention, at least one of the monocrystalline silicon semiconductor regions directly contacts the polycrystalline silicon of an adjacent barrier region.

According to a further feature of the invention, at least one resistance region is provided within the barrier region, with this resistance region being a doped polycrystalline silicon region provided adjacent the outer surface of the polycrystalline layer of the barrier region. This feature of the present invention provides the advantage, particularly for the production of bipolar circuits, that passive electrical resistors and/or resistor networks can be produced in an economical manner. According to the prior art, this is possible only in a disadvantageous manner such as by means of diodes and/or transistors.

The above object is likewise achieved according to the invention by a transistor which comprises: a monocrystalline silicon substrate of one conductivity type having a first region of the opposite conductivity type formed along a portion of one major surface thereof; a layer of silicon oxide formed on the one major surface; a layer of polycrystalline silicon disposed on and covering the oxide layer; first and second spaced windows extending through the polycrystalline silicon layer and the oxide layer over the first region; a second monocrystalline silicon region of the opposite conductivity type formed on and covering the portion of the first region within the first window and having thickness greater than that of the oxide layer; a third monocrystalline silicon region of the opposite conductivity type formed on and covering the portion of the first region within the second window and having a thickness greater than that of the oxide layer; a fourth monocrystalline silicon region of the first conductivity type formed within the third monocrystalline silicon region adjacent its outer surface and forming a pn-junction with the third region which extends to the outer surface of the third region; a fifth monocrystalline silicon region of the opposite conductivity type formed within the fourth monocrystalline silicon region adjacent its outer surface and forming a pn-junction with the fourth region which extends to the outer surface of the fourth region; and respective first, second and third contact means for ohmmically contacting the second, fourth and fifth monocrystalline regions, respectively.

Moreover, according to another aspect of the invention, during production of the structured semiconductor body according to the invention, at least one of the monocrystalline silicon semiconductor regions and the polycrystalline silicon semiconductor layer of the adjacent barrier region are simultaneously produced by differential silicon molecular beam epitaxy on a surface of a monocrystalline silicon substrate having an apertured silicon dioxide layer thereon.

A more complete appreciation of the invention and many of the attendant advantages thereof will be readily perceived as the same becomes better understood by reference to the following detailed description when considered in connection with the accompanying figures.

DESCRIPTION OF THE PREFERRED EMBODIMENTS

The present invention is based on the use, to be described below, of the so-called method of differential epitaxy as applied onto a silicon-containing material as disclosed, for example, in the periodical "Journal of the Electrochemical Society," Vol. 132, page 2227 (1985). In this process, a silicon layer is grown, in an ultra high vacuum system in the presence of a vacuum of less than about $10^{-9}$ mbar and with the aid of a silicon molecular beam epitaxy process (Si MBE), on a silicon substrate having monocrystalline silicon (Si) regions adjacent to silicon dioxide ($SiO_2$) regions. By selecting the temperature of the silicon substrate and the silicon growth rate of the silicon, it is simultaneously possible to grow monocrystalline silicon material on the monocrystalline silicon regions while polycrystalline silicon material is precipitated on the silicon oxide ($SiO_2$) regions, with the specific conductivity of the polycrystalline silicon material being lower by several orders of magnitude than that of the monocrystalline silicon material. A precisely defined transition is thus produced between the polycrystalline silicon material and the monocrystalline silicon material.

Figure 1:
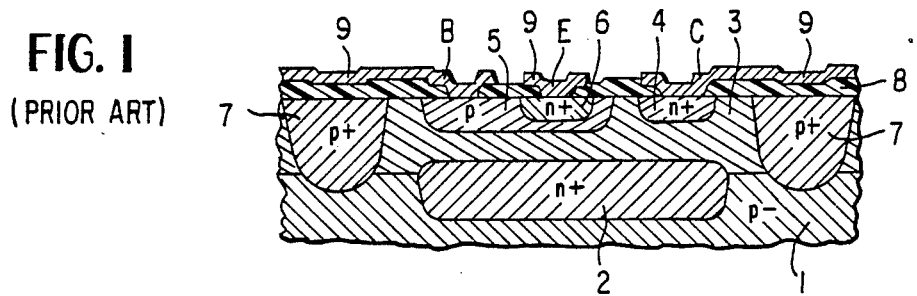
FIG. 1 is a schematic cross-sectional view of an exemplary structured semiconductor body according to the prior art which can be used in particular for the production of bipolar integrated circuits.

The above described characteristics produced between a polycrystalline silicon component and a monocrystalline silicon component can be utilized to produce the semiconductor structure which has been selected as an example of an embodiment of the invention and will now be described in greater detail with reference to FIGS. 2 and 3 wherein the same reference numerals used in FIG. 1 are used to denote corresponding structures.

Figure 2:
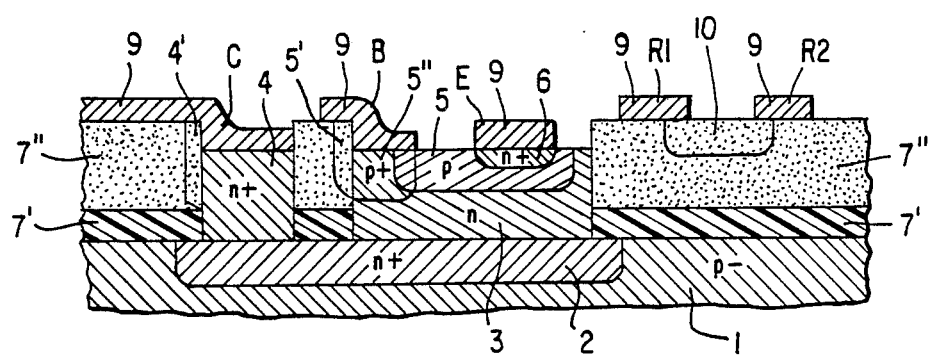
FIG. 2 is a schematic cross-sectional view of an embodiment of a structured semiconductor body according to the invention, with the illustrated device corresponding to that of FIG. 1.
Figure 3:
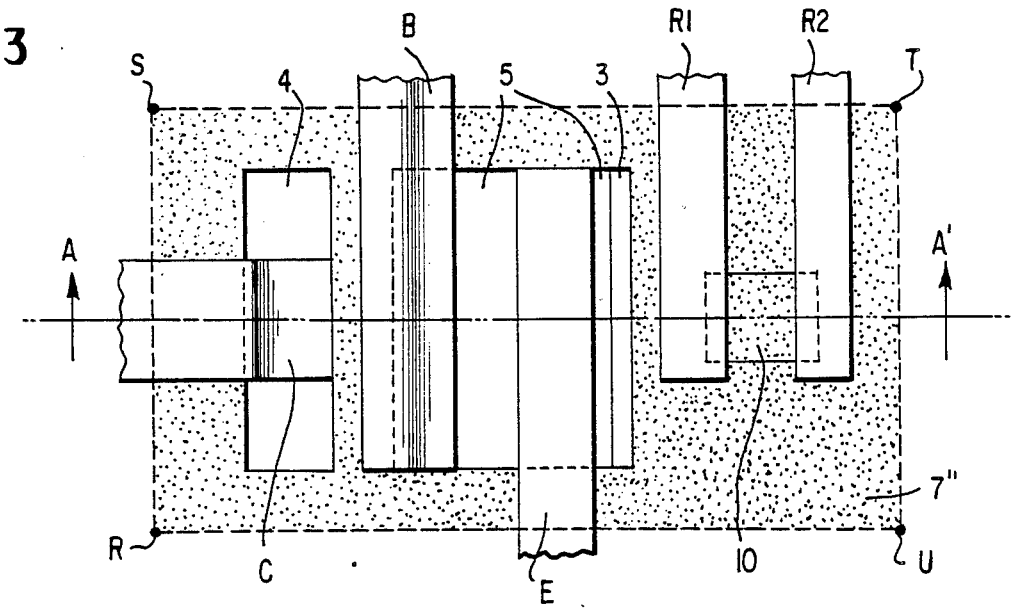
FIG. 3 is a plan view of the embodiment of the invention shown in FIG. 2, with the line A-A' indicating the line through which the cross-section of FIG. 2 was taken.

In order to produce the embodiment of the present invention shown in FIGS. 2 and 3, the n+ doped buried semiconductor zone 2 is initially formed in the p⁻ doped silicon substrate 1 adjacent its major surface in a conventional manner. Then, the major surface of the silicon substrate 1 including the semiconductor zone 2 are completely covered by an approximately 0.2 μm thick silicon oxide ($SiO_2$) layer 7' which is thermally produced at a temperature of about 950° C. Two adjacent substantially rectangular windows, which are spaced from one another by about 3 μm, are then etched through the silicon oxide layer 7' within the region thereof overlying the buried semiconductor zone 2. The collector contact window (the window on the left in FIG. 2) provided here has a size of 3 μm×50 μm and the base/emitter window (the window on the right in FIG. 2) provided here has a size of 6 μm×50 μm.

The silicon MBE method is then employed over the entire surface area to precipitate n doped silicon by means of antimony (Sb) at a substrate temperature of about 650° C. The flux densities of the Si-beam and the Sb-beam are adjusted to $2 \times 10^{15}/cm^2$ sec and $1.5 \times 10^{15}/cm^2$ sec, respectively. Growth time is 1500 sec. This causes monocrystalline semiconductor regions 3 and 4 to be produced within the above-created windows. The regions 3 and 4 each have a layer thickness of about 0.6 μm and an Sb concentration of about $1 \times 10^{16}/cm^3$. Outside of the above-described windows, a polycrystalline silicon layer 7'' is produced on the oxide layer 7', with the polycrystalline silicon layer 7'' having a layer thickness of likewise about 0.6 μm, and containing an Sb concentration of likewise about $1 \times 10^{16}/cm^3$ but exhibiting a specific electrical conductivity which is several orders of magnitude smaller than that of the adjacent monocrystalline layer. With the stated layer thicknesses, the monocrystalline silicon regions and the polycrystalline silicon regions contact one another in the illustrated manner.

By means of a doping process, such as a diffusion or an implantation process, n+phosphorus (P) doping is then produced in the semiconductor collector contact region 4 to provide a phosphorus concentration of about $1 \times 10^{20}/cm^3$. In the same manner, it is also possible to likewise dope the adjacent polycrystalline silicon region 4'.

A base region 5 is then produced within the semiconductor region 3 adjacent its outer surface with this base region 5 being p-doped by means of the introduction of boron (B) so as to provide a boron concentration of about $10^{18}/cm^3$ and a thickness of about 0.3 μm. As shown, the p-type base region 5 is formed completely within the n-type region 3 so that the pn-junction formed between same extends to the outer surface of the region 3.

In order to ohmically contact the base zone 5, a base contact region 5'' is produced in the surface of region 3 adjacent to the base region 5. This base contact region 5'' is p+ doped by means of boron and has a boron concentration of about $10^{20}/cm^3$ and a layer thickness of about 0.4 μm. If desired, and in a like manner, it is also possible to likewise dope the adjacent region 5' of the polycrystalline silicon layer 7''. Finally, in order to complete the region or zone sequence of the transistor, an n+ emitter region 6 is formed within the base region 5 adjacent its outer surface. The n+ emitter region 6 is produced within the base region 5 by, for example, doping with arsenic (As) to provide an arsenic concentration of about $3 \times 10^{19}/cm^3$.

In the arrangement just described, differently doped monocrystalline semiconductor regions 3, 4 have been produced which are separated by the barrier regions 7 which contain and are substantially formed by polycrystalline silicon 7''.

The collector, base and emitter regions are ohmically contacted by means of the structured metalization layer 9 which is divided into respective metal conductive paths. These metal conductive paths, which are composed, for example, of an aluminum-silicon (Al/Si) alloy, have a thickness of about 1 μm and a width of about 3 μm (see FIG. 3). As shown in FIGS. 2 and 3, the respective metal paths contact the region 4, the regions 5 and 5'', and the region 6 to provide the collector terminal C, the base terminal B and the emitter terminal E of the transmitter.

The polycrystalline silicon layer 7'' has a specific electrical conductivity which is smaller by several orders of magnitude than that of the monocrystalline silicon semiconductor regions. It is possible, therefore, to integrate passive electrical resistances into the structured semiconductor body, and in particular into the layer 7", in an economical manner.

For this purpose, a region such as the resistance region 10 disposed in polycrystalline silicon layer 7" adjacent its outer surface is so heavy doped that a usable conductivity of, for example, about $10^2$ Ohm $(cm)^{-1}$ results in the region 10. This doping can be done, for example, during the n+ doping of the emitter region 6. By modifying or adjusting the geometrical dimensions such as length, width and thickness, of the doped semiconductor region 10, it is possible to produce a desired resistance value for the resistance region 10 of for example about 1 kOhm. The resistance region 10 can then be contacted by means of conductor paths marked R1 and R2 disposed on the outer surface of the polycrystalline silicon layer 7".

In accordance with the invention, it is possible to produce a combination of, for example, several transistors as shown in FIGS. 2 and/or a passive resistance network as an integrated circuit component.

Moreover, the present invention is not limited to the described embodiments but can be similarly applied for devices other than the described transistor, or transistor and resistor networks. For example, it is possible to etch away the region of the polycrystalline silicon 7" outside the square marked RSTU in FIG. 3 and thus produce a transition to the prior art bipolar technology.

The present disclosure relates to the subject matter disclosed in German Patent application, No. P 35 45 238.2 of Dec. 20th, 1985, the entire specification of which is incorporated herein by reference.

It will be understood that the above description of the present invention is susceptible to various modifications, changes and adaptations, and the same are intended to be comprehended within the meaning and range of equivalents of the appended claims.

What is claimed is:

1. In a semiconductor device including a structured semiconductor body comprising at least a plurality of differently doped monocrystalline silicon semiconductor regions which are formed on a planar major surface of a silicon substrate and which are delimited by at least one insulating barrier region which prevents undesirable electrical current flow between said monocrystalline silicon semiconductor regions, the improvements wherein: said insulating barrier region comprises a layer of silicon oxide containing openings formed on said major surface of said silicon substrate, and a layer of poorly conducting polycrystalline silicon grown on the outer surface of said silicon oxide layer; said monocrystalline semiconductor regions are disposed on said major surface within said openings provided in said layer of silicon oxide; said monocrystalline regions and said polycrystalline layer have the same thickness and were grown by a differential silicon molecular beam epitaxy process; and at least one resistor is provided within said polycrystalline silicon layer of said insulating barrier region, said resistor comprising a highly doped region of said polycrystalline silicon layer disposed at the outer surface of said polycrystalline layer, and surrounded by said poorly conducting polycrystalline silicon of said polycrystalline layer at said outer surface of said poorly conducting polycrystalline layer.

2. The semiconductor device of claim 1, wherein said silicon oxide is silicon dioxide.

3. The semiconductor device of claim 1, wherein at least one of said monocrystalline silicon semiconductor regions directly contacts said polycrystalline silicon layer of an adjacent said barrier region.

4. The semiconductor device of claim 1 wherein said device is an integrated circuit.

5. The semiconductor device of claim 1 further comprising respective electrodes for said monocrystalline semiconductor regions disposed on the outer surface of said regions.

6. A semiconductor device as defined in claim 1 wherein said polycrystalline silicon layer has a specific conductivity which is at least several orders of magnitude smaller than the specific conductivity of said monocrystalline regions.

7. A semiconductor device as defined in claim 3 wherein said polycrystalline silicon layer has a specific conductivity which is at least several orders of magnitude smaller than the specific conductivity of said monocrystalline regions.

8. A semiconductor device as defined in claim 7 wherein said polycrystalline layer and said at least one of said monocrystalline silicon semiconductor regions have approximately the same impurity concentration of the same impurity.

9. A transistor as defined in claim 7 wherein said second monocrystalline silicon region is formed entirely on said first monocrystalline silicon region.

10. A transistor as defined in claim 7 wherein said second and said third monocrystalline silicon regions are each formed entirely on said first monocrystalline silicon region.

11. The semiconductor device of claim 1 further comprising first and second contacts for said highly doped polycrystalline silicon resistor region disposed on said outer surface of said polycrystalline silicon layer.

12. A transistor comprising:
a monocrystalline silicon substrate of one conductivity type having a first region of the opposite conductivity type formed along a portion of one major surface thereof; a layer of silicon oxide formed on a portion of said one major surface; an insulating layer of poorly conducting polycrystalline silicon disposed on and covering said oxide layer; first and second spaced windows extending through the portions of said polycrystalline silicon layer and said oxide layer over said first region; a second monocrystalline silicon region of said opposite conductivity type formed on and covering the portion of said first region within said first window and having a thickness greater than said oxide layer; a third monocrystalline silicon region of said opposite conductivity type formed on and covering the portion of said first region within said second window and having a thickness greater than said oxide layer; a fourth monocrystalline silicon region of said first conductivity type formed within said third monocrystalline silicon region adjacent its outer surface and forming a pn-junction with said third region which extends to said outer surface of said third region; a fifth monocrystalline silicon region of said opposite conductivity type formed within said fourth monocrystalline silicon region adjacent its outer surface and forming a pn-junction with said fourth region which extends to said outer surface of said fourth region; and respective first, second and third contact means for ohmically contacting said second, fourth and fifth monocrystalline silicon regions.

13. A transistor as defined in claim 12 wherein: said first, second and fifth monocrystalline regions are more heavily doped than said third monocrystalline region; and said first, second and third contact means comprise collector, base and emitter contacts respectively for the transistor.

14. A transistor as defined in claim 12 wherein said second and third monocrystalline regions and said polycrystalline layer were grown by a differential silicon molecular beam epitaxy process and said polycrystalline layer has a specific conductivity which is several orders of magnitude smaller than those of said second and third monocrystalline regions.

15. A transistor as defined in claim 12 wherein said major surface is planar and wherein said second and third monocrystalline regions and said polycrystalline layer have the same thickness.

16. A transistor as defined in claim 12 wherein said polycrystalline layer contains the same impurity as said third monocrystalline region and has a specific conductivity which is several orders of magnitude smaller than that of said third monocrystalline regions.

17. A transistor as defined in claim 13 wherein said polycrystalline layer has substantially the same impurity concentration of the same impurity as said third monocrystalline region and has a specific conductivity which is several orders of magnitude smaller than that of said third monocrystalline regions.

18. A transistor as defined in claim 12 wherein said second monocrystalline silicon region is formed entirely on said first monocrystalline silicon region.

* * * * *